United States Patent
Xu et al.

(10) Patent No.: US 10,250,115 B2
(45) Date of Patent: Apr. 2, 2019

(54) INVERTER SWITCHING DEVICES WITH COMMON SOURCE INDUCTANCE LAYOUT TO AVOID SHOOT-THROUGH

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 22 days.

(21) Appl. No.: 15/341,184

(22) Filed: Nov. 2, 2016

(65) Prior Publication Data
US 2018/0123478 A1   May 3, 2018

(51) Int. Cl.
| | | |
|---|---|---|
| *H02M 1/08* | (2006.01) | |
| *H02M 7/00* | (2006.01) | |
| *H03K 17/08* | (2006.01) | |
| *H03K 17/0814* | (2006.01) | |
| *H03K 17/16* | (2006.01) | |

(Continued)

(52) U.S. Cl.
CPC ............ *H02M 1/08* (2013.01); *H02M 7/003* (2013.01); *H03K 17/08* (2013.01); *H03K 17/08148* (2013.01); *H03K 17/162* (2013.01); *H01L 2224/48247* (2013.01); *H02M 1/084* (2013.01);

(Continued)

(58) Field of Classification Search
CPC ........ H02M 1/08; H02M 1/084; H02M 1/088; H02M 7/537; H02M 7/538; H02M 7/5387; H02M 7/003
See application file for complete search history.

(56) References Cited

U.S. PATENT DOCUMENTS

| | | | |
|---|---|---|---|
| 6,906,404 B2 * | 6/2005 | Maly | H01L 25/072 257/678 |
| 7,492,138 B2 | 2/2009 | Zhang et al. | |

(Continued)

FOREIGN PATENT DOCUMENTS

WO    2015121899 A1    8/2015

OTHER PUBLICATIONS

Ichikawa et al, Modules for Hybrid Vehicle Motor Driving, Fuji Electric Review, vol. 55, No. 2, pp. 46-50, 2009.

*Primary Examiner* — Fred E Finch, III
*Assistant Examiner* — Rafael O. De León Domenech
(74) *Attorney, Agent, or Firm* — David B. Kelley; MacMillan, Sobanski & Todd, LLC (57) ABSTRACT

A phase leg in an inverter bridge has an upper transistor with upper gate, collector, and emitter terminals, wherein the upper gate and emitter terminals are arranged to create an upper common source inductance. A lower transistor has lower gate, collector, and emitter terminals, wherein the lower gate and emitter terminals are arranged to create a lower common source inductance. An upper diode is coupled across the upper collector and emitter terminals and substantially in parallel with the upper common source inductance. A lower diode is coupled across the lower collector and emitter terminals and substantially in parallel with the lower common source inductance. Thus, the diodes substantially bypass the common source inductances when carrying commutation current when one of the transistors is switching off. This allows the phase leg to possess significant common source inductance at the gate terminals while avoiding "shoot-through" issues.

5 Claims, 6 Drawing Sheets

(51) Int. Cl.
   *H02M 7/5387* (2007.01)
   *H02M 1/084* (2006.01)
   *H02M 7/537* (2006.01)
   *H02M 1/088* (2006.01)
   *H02M 7/538* (2007.01)

(52) U.S. Cl.
   CPC ............ *H02M 1/088* (2013.01); *H02M 7/537* (2013.01); *H02M 7/538* (2013.01); *H02M 7/5387* (2013.01)

(56) References Cited

U.S. PATENT DOCUMENTS

| | | | |
|---|---|---|---|
| 7,564,292 B2 | 7/2009 | Havanur | |
| 9,331,061 B2 | 5/2016 | De Rooij et al. | |
| 9,595,500 B2* | 3/2017 | Kouno | H01L 23/4334 |
| 2009/0016088 A1* | 1/2009 | Bayerer | H01L 24/24 |
| | | | 363/125 |
| 2010/0328833 A1 | 12/2010 | Frisch et al. | |
| 2013/0341776 A1* | 12/2013 | Drobnik | H01L 23/5385 |
| | | | 257/675 |
| 2015/0014746 A1* | 1/2015 | Inada | H01L 29/41725 |
| | | | 257/192 |
| 2015/0023081 A1 | 1/2015 | Obiraki et al. | |
| 2016/0294275 A1* | 10/2016 | Pronovost | H03K 17/166 |
| 2017/0117798 A1* | 4/2017 | Basler | H02M 1/32 |

\* cited by examiner

INVERTER SWITCHING DEVICES WITH COMMON SOURCE INDUCTANCE LAYOUT TO AVOID SHOOT-THROUGH

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching devices in an inverter bridge, and, more specifically, to inverter drive systems for electrified vehicles using discrete power switching devices with high switching efficiency.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because each phase leg of the inverter has a pair of upper and lower switching transistors connected across the DC link, it is important that both devices in a leg not be conducting (i.e., turned-on) simultaneously. A short time interval (known as dead-time) is typically inserted in the PWM switching signals during which both the upper and lower switching devices of a phase leg are turned off in order to prevent such shoot-through.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition, as long as other potential side effects are contained. For example, a large common source inductance may increase the potential for the occurrence of shoot-through.

SUMMARY OF THE INVENTION

In one aspect of the invention, a phase leg is configured to possess significant common source inductance at the gate terminals in a manner that avoids "shoot-through." An upper transistor has upper gate, collector, and emitter terminals, wherein the upper gate and emitter terminals are arranged to create an upper common source inductance. A lower transistor has lower gate, collector, and emitter terminals, wherein the lower gate and emitter terminals are arranged to create a lower common source inductance. An upper diode is coupled across the upper collector and emitter terminals and substantially in parallel with the upper common source inductance. A lower diode is coupled across the lower collector and emitter terminals and substantially in parallel with the lower common source inductance. Thus, the diodes substantially bypass the common source inductances when carrying commutation current when one of the transistors is switching off.

DETAILED DESCRIPTION OF PREFERRED EMBODIMENTS

Figures 1, 2:
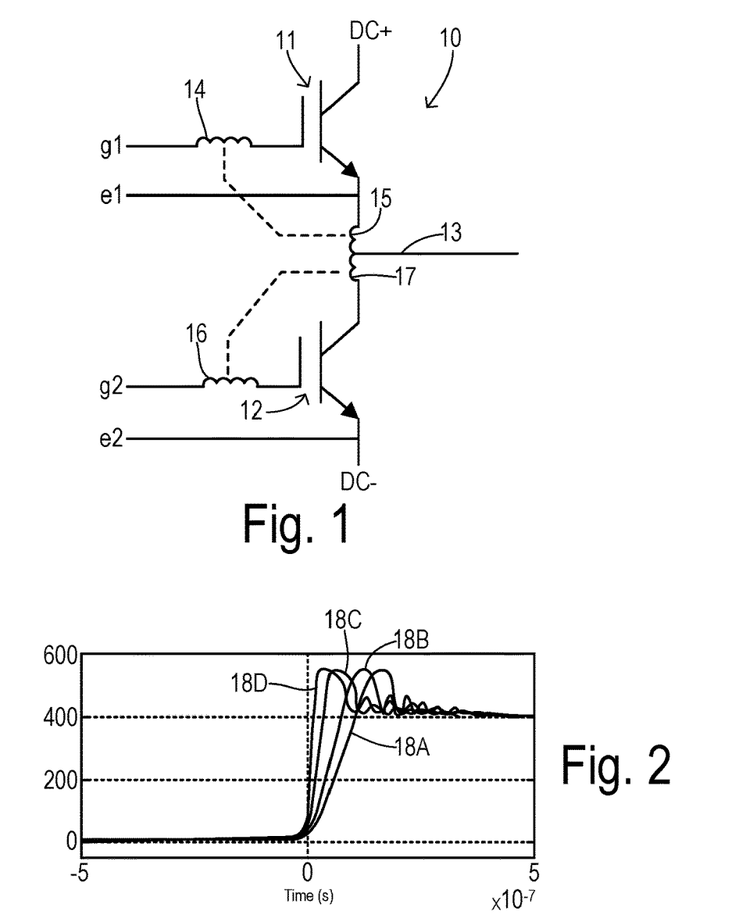
FIG. 1 is a schematic diagram showing an equivalent circuit for a phase leg of an inverter having a pair of IGBTs giving rise to a common source inductance.
FIGS. 2 and 3 are graphs showing changes in output voltage spike and switching energy, respectively, for varying levels of common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a phase leg 10 of the type often used in an inverter drive system in an electrified vehicle for driving an electric motor. Power transistor devices 11 and 12 (such as IGBTs or power MOSFETs) are connected in series across a DC link having positive and negative DC buses. A junction 13 between transistors 11 and 12 provides an AC output of phase leg 10. Transistor 11 has a gate terminal g1 and an emitter terminal (e.g., a Kelvin emitter) e1, and transistor 12 has a gate terminal g2 and an emitter terminal e2. A gate inductance 14 associated with transistor 11 is magnetically coupled to an output power loop inductance 15 also associated with transistor 11. A gate inductance 16 associated with transistor 12 is magnetically coupled to an output power loop inductance 17 also associated with transistor 12.

The coupling between a power loop and a gate loop can sometimes create undesirable interactions in which changes in the output current from a device causes changes in the gate signal which is attempting to control the device. Therefore, typical design rules used during development of transistor device packaging and circuits using such devices have aimed to minimize the common source inductance.

Figure 3:
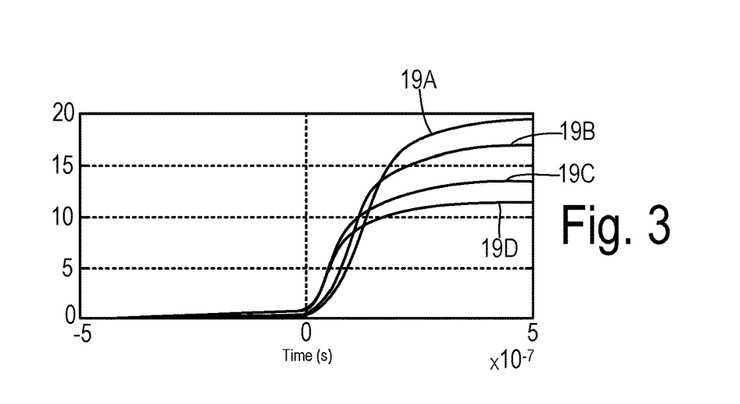

For a transistor in a phase leg, the influence of the magnitude of the common source inductance on the switching time and voltage overshoot is shown in FIG. 2 which depicts the changing collector to emitter voltage ($V_{CE}$) across a transistor over time during a transition from the ON state to the OFF state. Traces 18A, 18B, 18C, and 18D correspond to a common source inductance ($L_{CSI}$) of 0 nH, 1 nH, 2 nH, and 3 nH, respectively. Thus, as $L_{CSI}$ increases from 0 to 3 nH, the switching time is favorably reduced while the size of the voltage overshoot or spike remains substantially constant. The reduced switching time leads to lower energy loss (i.e., increased efficiency) as shown in FIG. 3. Traces 19A, 19B, 19C, and 19D correspond to an $L_{CSI}$ of 0 nH, 1 nH, 2 nH, and 3 nH, respectively. Thus, as $L_{CSI}$ increases from 0 to 3 nH, the energy consumed in the transistor drops from almost 19 mJ to about 11 mJ. Therefore, it has been recognized that a higher $L_{CSI}$ can reduce switching loss while keeping the same voltage spikes.

The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance.

Figure 4:
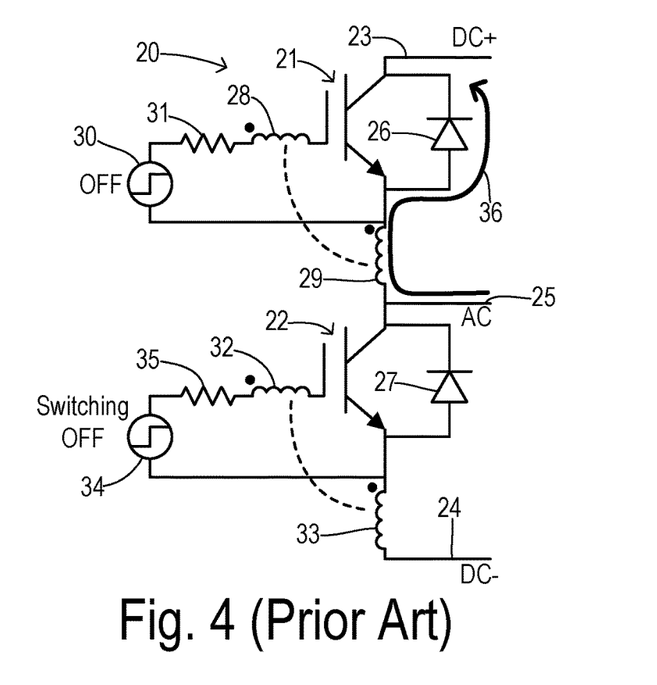
FIG. 4 is a schematic diagram of an inverter phase leg showing a commutation current in an upper anti-parallel diode during turn-off of a lower transistor.

If $L_{CSI}$ is increased too much, however, the potential side effect of shoot-through could occur as shown in FIG. 4. A conventional phase leg 20 has an upper transistor 21 having upper gate, collector, and emitter terminals, wherein the upper gate and emitter terminals create an upper common source inductance comprised of gate loop inductance 28 and power loop inductance 29. A gate driver 30 and gate resistor 31 are coupled to the gate terminal in order to control the switching of upper transistor 21. An upper diode is coupled across the upper collector and emitter terminals in a direction anti-parallel to transistor 21.

Figure 5:
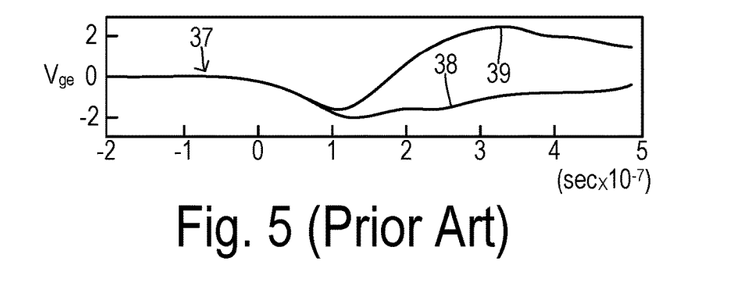
FIG. 5 is a graph showing gate voltage in an upper gate terminal induced by a commutation current via the common source inductance for both low and high levels of common source inductance.

A lower transistor 22 having lower gate, collector, and emitter terminals is connected in series with upper transistor 21 at a junction 25 between positive bus 23 and negative bus 24. The lower gate and emitter terminals create a lower common source inductance comprised of gate loop inductance 32 and power loop inductance 33. A gate driver 34 and gate resistor 35 are coupled to the gate terminal in order to control the switching of lower transistor 22. A lower diode is coupled across the lower collector and emitter terminals in a direction anti-parallel to transistor 22. FIG. 4 shows a switching state wherein lower transistor 22 has been conducting and is in the process of being switched off by gate driver 34 (transistor 21 is already OFF). With transistor 22 turning off, the current that had been flowing from the AC output at junction 25 through transistor 22 is commutated from transistor 22 to upper diode 26 as shown by arrow 36. Current through upper diode 26 also flows through inductance 29, thereby causing a voltage drop on inductance 29 which in turn induces a voltage at the gate terminal of upper transistor 21 via inductance 28. FIG. 5 shows an induced gate voltage $V_{GE}$ for upper transistor 21 along a curve 37. For lower levels of common source inductance $L_{CSI}$, the induced gate voltage $V_{GE}$ remains inconsequential as shown along curve 38. At a higher $L_{CSI}$, however, a greater gate voltage $V_{GE}$ is induced as shown by curve 39. If the gate-to-emitter voltage $V_{GE}$ exceeds the threshold voltage of transistor 21 then upper transistor 21 may turn on, resulting in a shoot-through condition since both transistors could be partially conducting.

Figure 6:
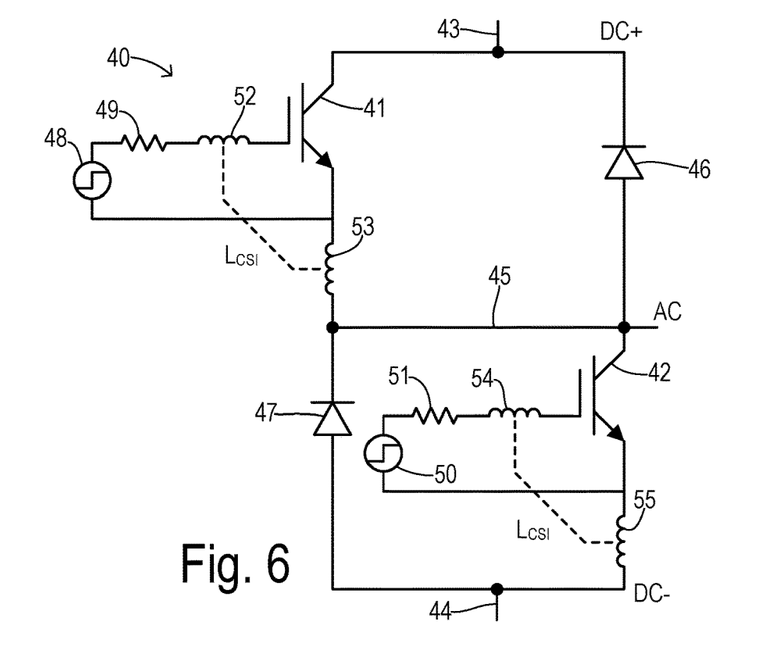
FIG. 6 is a schematic diagram showing an equivalent circuit utilized in the present invention to reduce the gate voltage induced by the commutation current without reducing the common source inductance.

The invention enables deliberate increases in the common source inductance while avoiding increasing the $V_{GE}$ of an unswitched transistor during the switching process of its complementary transistor in the phase leg. Unlike the prior art wherein the current commutation paths include both an anti-parallel diode and the structures that create the common source inductance, the present invention reconfigures the placement of the anti-parallel diode so that the commutation current substantially does not flow through the common source inductance. As shown in FIG. 6, a phase leg 40 has an upper transistor (e.g., IGBT) 41 with upper gate, collector, and emitter terminals and a lower transistor 42 with lower gate, collector, and emitter terminals. Transistors 41 and 42 have an intermediate junction 45 and are connected in series between a positive bus 43 and a negative bus 44. An upper anti-parallel diode 46 is coupled across the upper collector and emitter terminals of upper transistor 41. A lower anti-parallel diode 47 is coupled across the lower collector and emitter terminals of lower transistor 42. An upper gate driver 48 drives the gate terminal of transistor 41 via a gate resistor 49. A lower gate driver 50 drives the gate terminal of transistor 42 via a gate resistor 51.

The upper gate and emitter terminals are arranged to create an upper $L_{CSI}$ as a result of coupling between a gate inductance 52 and a power loop inductance 53. The lower gate and emitter terminals are arranged to create a lower $L_{CSI}$ as a result of coupling between a gate inductance 54 and a power loop inductance 55. Upper diode 46 is substantially in parallel with upper common source inductance $L_{CSI}$ so that the commutation current through upper diode 46 when lower transistor 42 is switching off is directed away from inductance 53. In particular, upper diode 46 has an anode terminal connected to intermediate junction 45 substantially bypassing the upper $L_{CSI}$. Even though it may be difficult to eliminate all common source inductance from the circuit branch containing upper diode 46, it is sufficient that the majority of power loop inductance 53 is parallel to diode 46. As described more specifically below, structures that may be introduced for deliberately increasing the upper $L_{CSI}$ (such as loops in the conductors or tracing carrying the gate drive signal) may be physically separated from upper diode 46 to ensure that diode 46 remains in parallel with substantially all of the upper $L_{CSI}$. Likewise, lower diode 47 is substantially in parallel with lower common source inductance $L_{CSl}$ so that the commutation current through lower diode 47 when upper transistor 41 is switching off is directed away from inductance 55. In particular, lower diode 47 has an anode terminal connected to negative bus terminal 44 substantially bypassing the lower $L_{CSl}$.

Figure 7:
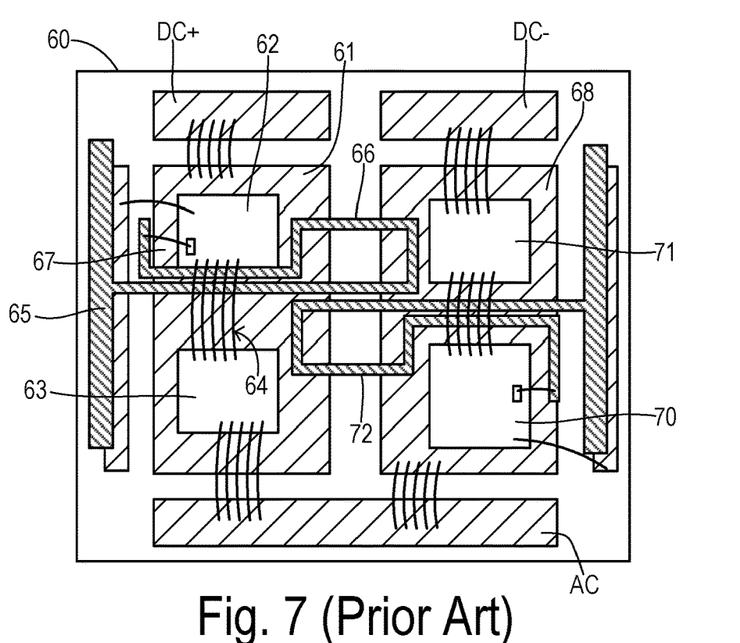
FIG. 7 is a diagram showing a layout of IGBTs and diodes in a 2-in-1 power module for a phase leg with a configuration having an equivalent circuit as shown in FIG. 4.

FIG. 7 shows a Direct Bonded Copper (DBC) substrate 60 used to construct a power card or power module having semiconductor devices connected to form a phase leg. DBC substrate 60 may include a ceramic layer with two metallization layers forming circuit traces and bonding pads, wherein the semiconductor devices and various bonding wires are soldered/bonded onto the traces. The power module may further include a lead frame with multiple input/output pins and an overmolded body encapsulating the module (not shown). In a conventional layout shown in FIG. 7, a single conductive pad 61 is provided on a surface of DBC substrate 60 to receive semiconductor dies for an upper IGBT 62 and an upper diode 63, wherein soldering of dies 62 and 63 makes electrical contact of the collector terminal of IGBT 62 and the cathode terminal of diode 63 to positive bus DC+ via pad 61. Bonding wires 64 interconnect the emitter terminal of IGBT 62 with the anode terminal of diode 63. A gate pad 65 is connected via a coiled gate trace 66 and a bonding wire 67 to a gate terminal of IGBT 62. For the lower portion of the phase leg, a conductive pad 68 receives a lower IGBT 70 and a lower diode 71. A coiled gate trace 72 and other aspects of the lower phase leg are similar to those for the upper phase leg. Pads for a negative bus DC– and an output junction AC are shown at respective edges of DBC 60.

Figure 8:
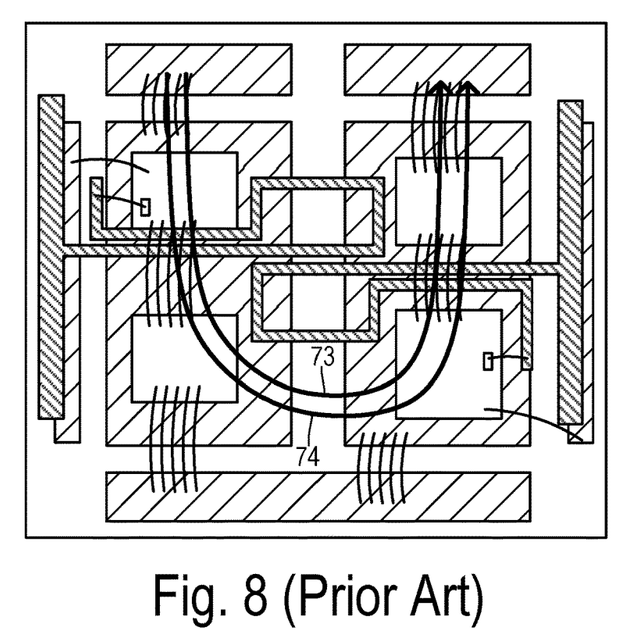
FIG. 8 is an annotation of the diagram of FIG. 7 showing the close coupling of the power loops for the upper and lower transistors.
Figure 9:
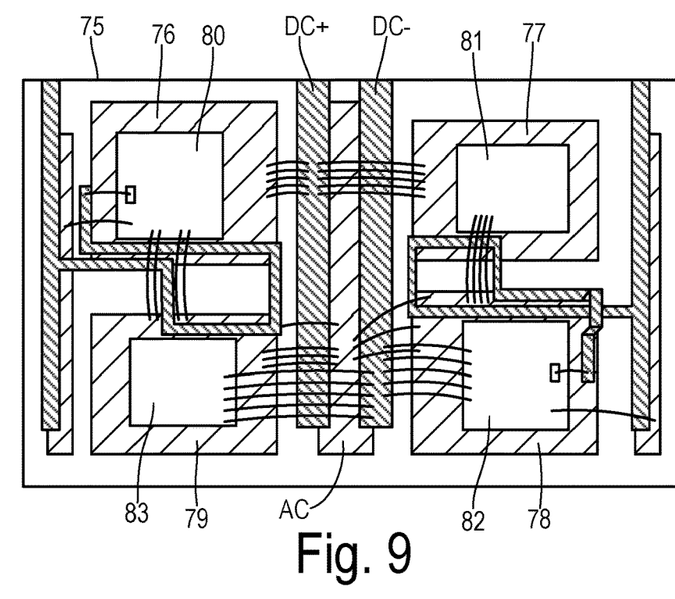
FIG. 9 a diagram showing a layout of IGBTs and diodes in a 2-in-1 power module for a phase leg of the invention with a configuration having an equivalent circuit as shown in FIG. 6.

In the layout of FIG. 7, the switching device and antiparallel diode for each respective half of the phase leg are close together both physically and electrically. In this arrangement, a power loop 73 for the upper phase leg and a power loop 74 for the lower phase leg are overlapping as shown in FIG. 8. As a consequence, gate coil 66 is overlapping both power loops 73 and 74. When lower IGBT 70 is switching off, magnetic flux is coupled across power loops 73 and 74 and then into gate loop 66, causing the gate voltage to change.

Figure 10:
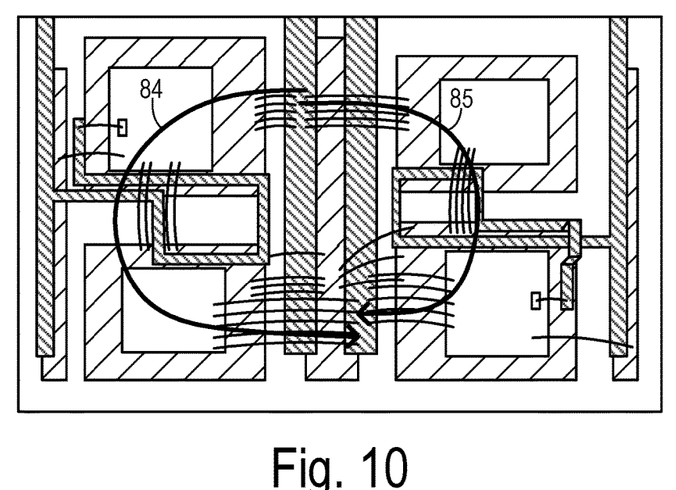
FIG. 10 is an annotation of the diagram of FIG. 9 showing the segregation of the power loops for the upper and lower transistors.

FIG. 8 shows one example of an improved layout for a 2-in-1 power card of the invention wherein a power module DBC substrate 75 carries a plurality of conductive layers, wherein the conductive layers define a positive rail (i.e., trace) DC+ and a negative rail DC– arranged between first and second mounting regions. For example, rails DC+ and DC– together with an output rail AC may be arranged to bisect a surface of substrate 75, providing first and second mounting regions on opposite sides of the rails. Separate conductive pads 76, 77, 78, and 79 are provided for upper IGBT 80, upper diode 81, lower IGBT 82, and lower diode 83, respectively. Thus, upper IGBT 80 and lower diode 83 are mounted in the first mounting region, and lower IGBT 82 and upper diode 81 are mounted in the second mounting region. Gate loops may be included for each IGBT in its respective mounting region, but since the anti-parallel diode for each IGBT is in the opposite mounting region the added common source inductance couples substantially only to its own power loop. FIG. 10 shows an upper power loop 84 and a lower power loop 85. Thus, each diode bypasses the common source inductance of its matching transistor.

Figure 11:
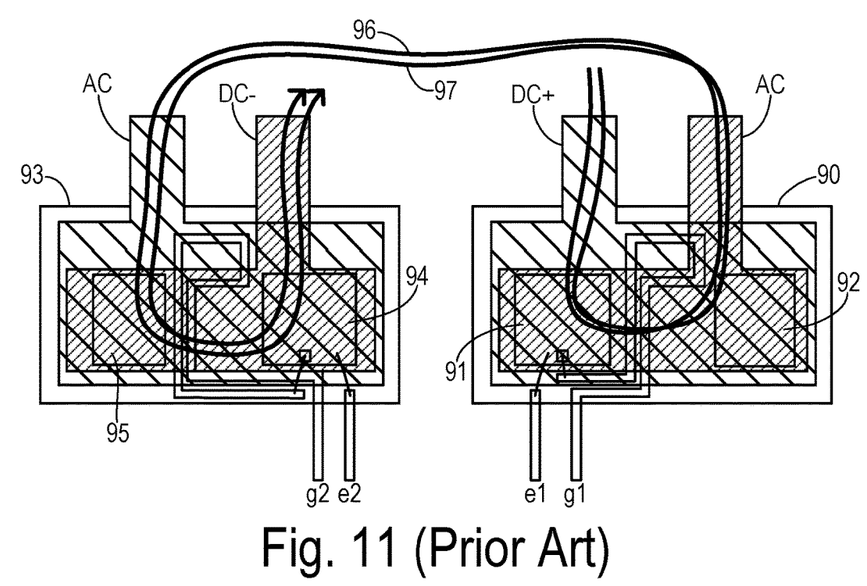
FIG. 11 a diagram showing a layout of IGBTs and diodes in a pair of 1-in-1 power modules for a phase leg with a configuration having an equivalent circuit as shown in FIG. 4.

FIG. 11 shows a pair of 1-in-1 power cards interconnected to form a phase leg. An upper phase leg substrate 90 receives an upper IGBT 91 and an upper diode 92, which are interconnected with layers/pins for a DC+ bus, an AC output, an emitter pin e1, and a gate pin g1. A lower phase leg substrate 93 receives a lower IGBT 94 and a lower diode 95, which are interconnected with layers/pins for a DC-bus, the AC output, an emitter pin e2, and a gate pin g2. In view of the transistor and diode for each half of the phase leg being packaged closely together, an upper power loop 96 and a lower power loop 97 are again closely coupled together. This close coupling and the enhanced common source inductance from using looping gate traces increases the potential for shoot-through caused by commutation current.

Figure 12:
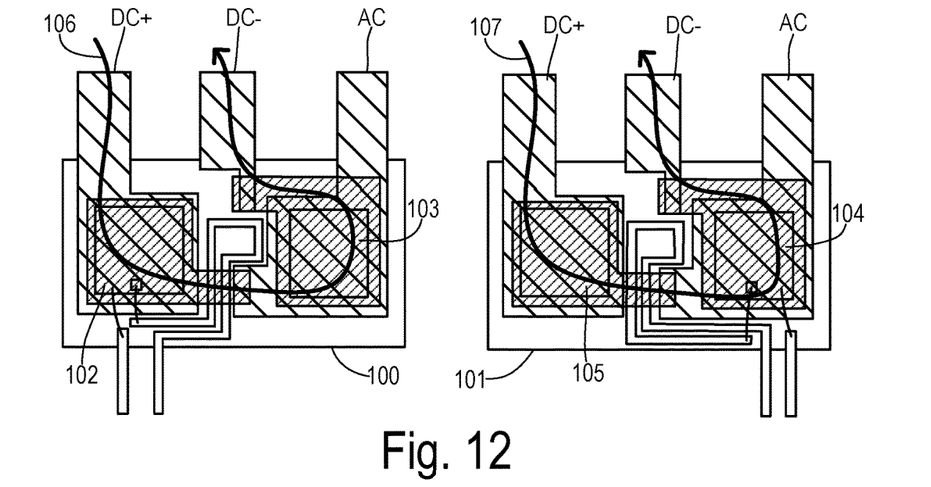
FIG. 12 a diagram showing a layout of IGBTs and diodes in a pair of 1-in-1 power modules for a phase leg of the invention with a configuration having an equivalent circuit as shown in FIG. 6.

FIG. 12 shows an embodiment of the invention for a pair of 1-in-1 power cards wherein each IGBT and its antiparallel diode are spaced apart by placing them on opposite power cards. Thus, a substrate 100 carries an upper IGBT 102 and a lower diode 103, while a substrate 101 carries a lower IGBT 104 and an upper diode 105. Each substrate needs to provide output pins for a positive bus DC+, and negative bus DC–, and an output AC so that the necessary interconnections of each IGBT with its diode can be made. However, the re-organization of components results in an upper power loop 106 being separated from a lower power loop 107 so that the associated fluxes will not be coupled, and shoot-through problems are avoided.

What is claimed is:

1. A phase leg comprising;
   an upper transistor having upper gate, collector, and emitter terminals, the upper gate and emitter terminals arranged to create an upper common source inductance;
   a lower transistor having lower gate, collector, and emitter terminals, the lower gate and emitter terminals arranged to create a lower common source inductance;
   an upper commutation diode coupled across the upper collector and emitter terminals and in parallel with the created upper common source inductance;
   a lower diode coupled across the lower collector and emitter terminals and substantially in parallel with the created lower common source inductance; and
   a power module substrate carrying a plurality of conductive layers, wherein the conductive layers define a positive rail and a negative rail arranged between first and second mounting regions, wherein the upper transistor and the lower diode are mounted to the substrate in the first mounting region, and wherein the upper transistor and the lower diode are mounted to the substrate in the first mounting region;
   wherein the transistors are connected in series between positive and negative bus terminals and have an intermediate junction providing an output of the phase leg, wherein the upper diode has an anode terminal connected to the intermediate junction substantially bypassing the created upper common source inductance; and wherein the lower diode has an anode terminal connected to the negative bus terminal substantially bypassing the created lower common source inductance.

2. The phase leg of claim 1 wherein the conductive layers further define an upper gate loop within the first mounting region and a lower gate loop within the second mounting region.

3. The phase leg of claim 1 wherein the transistors are each comprised of an insulated gate bipolar transistor (IGBT).

4. A power converter comprising:
   a DC link with positive and negative buses configured to receive a DC supply voltage;
   a phase leg comprising an upper transistor and a lower transistor coupled in series between the buses and an upper diode and a lower diode coupled across respective collector and emitter terminals of the respective upper and lower transistors, wherein a junction between the upper and lower transistors is configured to be coupled to a load, wherein the upper gate and emitter terminals are arranged to create an upper common source inductance, wherein the lower gate and emitter terminals are arranged to create a lower common source inductance, wherein the upper diode is coupled substantially in parallel with the upper common source inductance, and wherein the lower diode is coupled substantially in parallel with the lower common source inductance; and a gate driver coupled to the phase leg activating the upper transistor according to an upper gate signal and activating the lower transistor according to a lower gate signal;

wherein the phase leg further comprises a power module substrate carrying a plurality of conductive layers, wherein the conductive layers define a positive rail and a negative rail arranged between first and second mounting regions;

wherein the upper transistor and the lower diode are mounted to the substrate in the first mounting region; and wherein the lower transistor and the upper diode are mounted to the substrate in the second mounting region.

5. The power converter of claim 4 wherein the conductive layers further define an upper gate loop within the first mounting region and a lower gate loop within the second mounting region.

* * * * *